US 6,713,396 B2

(12) United States Patent
Anthony

(10) Patent No.: US 6,713,396 B2
(45) Date of Patent: Mar. 30, 2004

(54) METHOD OF FABRICATING HIGH DENSITY SUB-LITHOGRAPHIC FEATURES ON A SUBSTRATE

(75) Inventor: Thomas C. Anthony, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 3 days.

(21) Appl. No.: 10/135,900

(22) Filed: Apr. 29, 2002

(65) Prior Publication Data
US 2003/0203636 A1 Oct. 30, 2003

(51) Int. Cl.⁷ .......................................... H01L 21/306

(52) U.S. Cl. .................. 438/694; 438/696; 438/697; 438/703; 438/725

(58) Field of Search ................. 438/694, 696, 438/697, 703, 719, 725

(56) References Cited

U.S. PATENT DOCUMENTS 5,918,134 A * 6/1999 Gardner et al. ............. 438/305
6,475,916 B1 * 11/2002 Lee et al. .................... 438/706

* cited by examiner

Primary Examiner—Nadine G. Norton
Assistant Examiner—Binh X Tran
(74) Attorney, Agent, or Firm—Trueman H. Denny III

(57) ABSTRACT

A method of fabricating high density sub-lithographic features is disclosed. The method includes the use of common microelectronic processes including sub-lithographic spacer formation and Damascene processes to form a plurality of sub-lithographic spacers on vertical side wall surfaces of features carried by a substrate. The sub-lithographic spacers have a period that is less than a minimum resolution of a lithographic system. The density of features, including the sub-lithographic spacers, within a minimum resolution of the lithographic system, can be increased by subsequent depositions of material, followed by anisotropic etching to selectively remove horizontal surfaces of the deposited material. Optionally, the spacer materials can be conformally deposited.

20 Claims, 6 Drawing Sheets

METHOD OF FABRICATING HIGH DENSITY SUB-LITHOGRAPHIC FEATURES ON A SUBSTRATE

FIELD OF THE INVENTION

The present invention relates generally to a method of fabricating high density sub-lithographic features on a substrate. More specifically, the present invention relates to a method of fabricating high density sub-lithographic features on a substrate using common microelectronic processing techniques to form a plurality of sub-lithographic spacers on a substrate, wherein within a minimum resolution of a lithographic system, a density of features can be increased by a factor of two or more.

BACKGROUND OF THE ART

A standard method in the microelectronics industry for patterning features on a substrate uses well understood photolithographic processes. Typically, a layer of photoresist is coated onto a substrate material followed by exposing the photoresist with a light source through a mask. The mask includes patterned features, such as lines and spaces, that are to be transferred to the photoresist. After the photoresist is exposed, the photoresist is immersed in a solvent to define the patterns that were transferred to the photoresist. The patterns produced by this process are typically limited to line widths greater than a minimum resolution $\lambda$ of a photolithographic alignment tool, which is ultimately limited by a wavelength of light of a light source used to expose the photoresist. At present, a state of the art photolithographic alignment tool is capable of printing line widths as small as about 100.0 nm.

Features patterned into the photoresist are transferred into the substrate material using well known microelectronics processes such as reactive ion etching, ion milling, plasma etching, or chemical etching, for example. Using standard semiconductor processing methods, lines of width $\lambda$ or gratings (i.e. a line-space sequence) of a period $2\lambda$ can be created.

However, in many applications it is advantageous to have the line width or the period be as small as possible. Smaller line widths or periods translate into higher performance and/or higher density circuits. Hence, the microelectronics industry is on a continual quest to reduce the minimum resolution in photolithography systems and thereby reduce the line widths or periods on patterned substrates. The increases in performance and/or density can be of considerable economic advantage because the electronics industry is driven by a demand for faster and smaller electronic devices.

In FIG. 1a, a prior method of fabricating lines narrower than a minimum feature size $\lambda$ comprises controlling the etch process used to pattern a substrate material. A substrate 101 includes lines 103 having a minimum feature size $\lambda$ that is greater than or equal to a minimum resolution $\lambda$ of a lithographic system used to pattern the lines 103. Because of the minimum resolution $\lambda$ of the lithographic system, the lines 103 will be spaced apart by a space 105 that is also greater than or equal to $\lambda$. In FIG. 1a, the line 103 and space 105 pattern has a period of $2\lambda$. Accordingly, within the period of $2\lambda$ a density of features is two, that is, there is one line feature 103 and one space feature 105. Similarly, within the distance of $\lambda$, the density of features is one, that is, there is either a line 103 or a space 105 within the distance of $\lambda$.

In FIG. 1b, the lines 103 have their respective widths reduced to a width that is less than $\lambda$ by controlled lateral plasma etching such that a vertical sidewall s of the lines 103 prior to etching (see arrow e) recedes in a lateral direction to a reduced width (see dashed arrow r) that is less than $\lambda$ (i.e. $<\lambda$). However, the density of lines 103 has not been increased by the above method. In fact, due to the lateral etching, the lines 103 are made narrower than $\lambda$ (i.e. $<\lambda$) and the spaces 105 are made wider than $\lambda$ (i.e. $>\lambda$) due to the recession of the vertical sidewalls S. As a result, the density of features (103, 105) within the period of $2\lambda$ remains two and the density of features within the distance of $\lambda$ remains one.

Similarly, in FIG. 2a, if the features in a substrate 107 include a grating 109 having a line 111 and a space 113 that have a feature size that is greater than or equal to $\lambda$. Within a period of $2\lambda$, the number of features (111, 113) is two and the density of features within the distance of $\lambda$ remains one.

In FIG. 2b, after controlled lateral plasma etching, vertical sidewalls S have receded with the end result being the spaces 113 are wider than $\lambda$ (i.e. $>\lambda$) and the lines 111 are narrower than $\lambda$ (i.e. $<\lambda$). As before, the density of features (111, 113) within the period of $2\lambda$ remains two and the density of features within the distance of $\lambda$ remains one.

Therefore, there is a need for a method of fabricating sub-lithographic sized features that have a width that is narrower than a minimum resolution of a lithographic system. There also exists a need for a method of fabricating sub-lithographic sized features that increases a density of features within a minimum resolution of a lithographic system.

SUMMARY OF THE INVENTION

The method of fabricating high density sub-lithographic features of the present invention solves the aforementioned problems by using common microelectronic processes including sub-lithographic spacer formation and Damascene processes to form a plurality of sub-lithographic spacers on a substrate. The sub-lithographic spacers have a period that is less than a minimum resolution of a lithographic system. Spacers, in microelectronics processing parlance, are films that cover vertical side walls of features on a substrate. Damascene processing refers to a technique for creating inlaid patterns of a first material in a matrix of a second material by deposition of the first material into a depression defined in the second material, followed by removal of a portion of the first material by a planarization process. For example, a planarization process such as chemical mechanical planarization (CMP) can be used to remove and planarize the first material.

A density of features, including the sub-lithographic spacers, within a minimum resolution of the lithographic system is increased by the method of the present invention. Moreover, the density of features within the minimum resolution of the lithographic system can be further increased by subsequent depositions of material, followed by anisotropic etching to selectively remove horizontal surfaces of the deposited material. The depositions of the material can be conformal depositions wherein a horizontal thickness and a vertical thickness of the deposited material are substantially equal to each other.

Other aspects and advantages of the present invention will become apparent from the following detailed description, taken in conjunction with the accompanying drawings, illustrating by way of example the principles of the present invention.

DETAILED DESCRIPTION

Figure 1A:
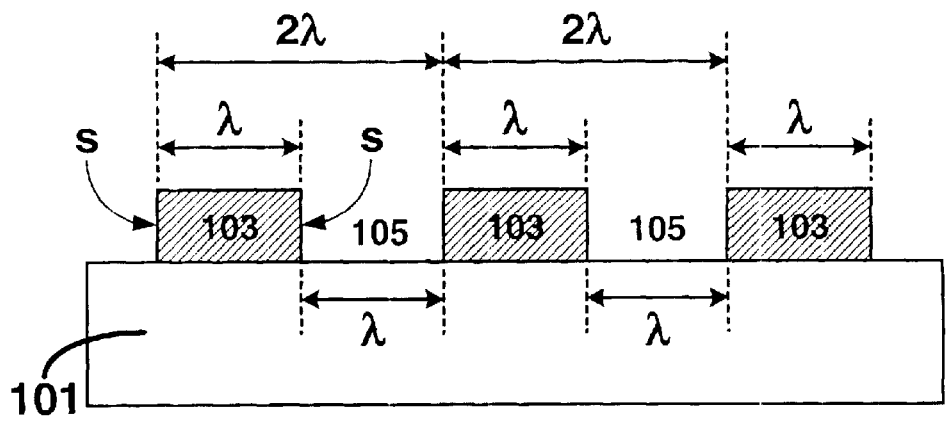
FIG. 1a is a cross-sectional view of a prior substrate having line features thereon with a period of twice a minimum resolution of a lithographic system.
Figure 1B:
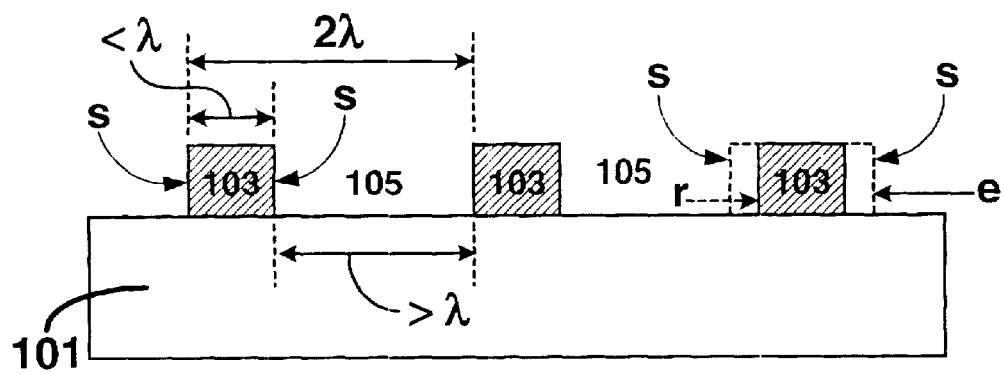
FIG. 1b is a cross-sectional view of FIG. 1a after a prior controlled lateral etching process is used to reduce a width of the lines.
Figure 2A:
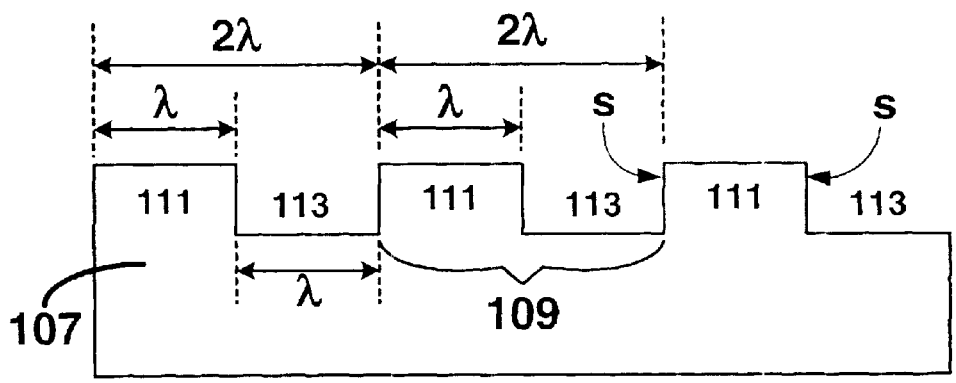
FIG. 2a is a cross-sectional view of a prior substrate having a grating thereon with features having a period of twice a minimum resolution of a lithographic system.
Figure 2B:
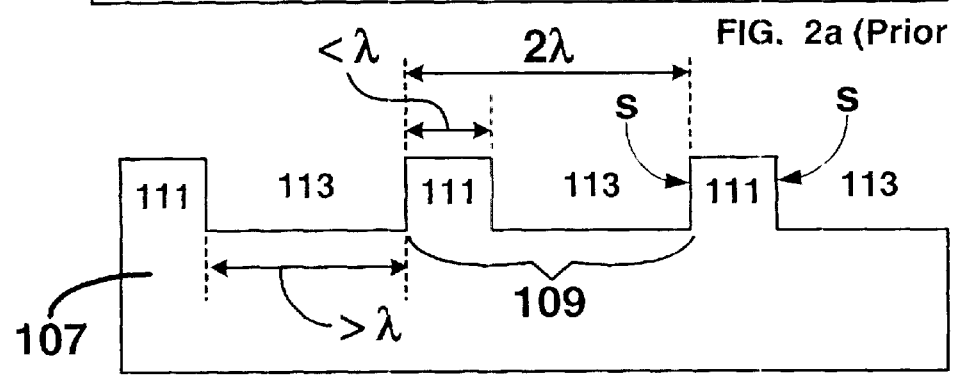
FIG. 2b is a cross-sectional view of FIG. 2a after a prior controlled lateral etching process is used to reduce a width of the features.

In the following detailed description and in the several figures of the drawings, like elements are identified with like reference numerals.

As shown in the drawings for purpose of illustration, the present invention is embodied in a method of fabricating high density sub-lithographic features. The method includes depositing a mask layer on a substrate and then patterning the mask layer to define an image that includes a minimum feature size that is greater than or equal to a minimum resolution of a lithographic system used for patterning the mask layer. The mask layer is then etched to transfer the image to the substrate thereby defining a feature on the substrate. The feature includes the minimum feature size and also includes horizontal surfaces and vertical side wall surfaces.

A spacer material is deposited on the feature such that the spacer material covers the horizontal surfaces and the vertical side wall surfaces. The deposition continues until the spacer material has a predetermined thickness that is less than the minimum feature size.

A density of features within the minimum feature size is increased by anisotropically etching the spacer material to selectively remove the spacer material from the horizontal surfaces. As a result, the spacer material remains on the vertical side wall surfaces and defines a plurality of sub-lithographic spacers that are in contact with the vertical side wall surfaces and extend laterally outward of the vertical side wall surfaces. The sub-lithographic spacers include a thickness that is less than the minimum feature size. Consequently, a density of features within the minimum feature size is greater than 2.0. That density includes the feature and the sub-lithographic spacers.

Optionally, the density of features within the minimum feature size can be further increased by repeating the above mentioned depositing and anisotropic etching steps to define additional sub-lithographic spacers on previously defined sub-lithographic spacers. The additional sub-lithographic spacers also include a thickness that is less than the minimum feature size.

Figure 3A:
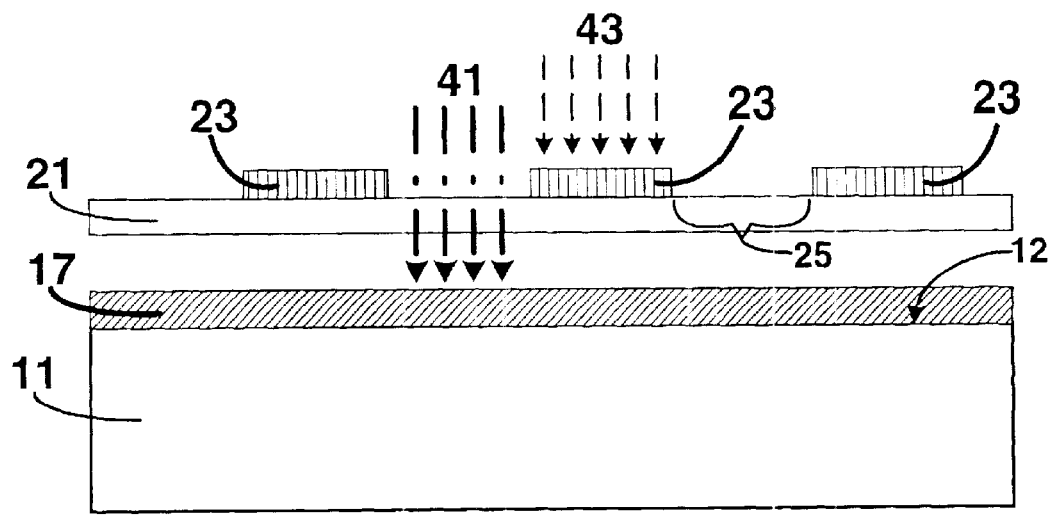
FIG. 3a is a cross-sectional view of photolithographic patterning of a mask layer according to the present invention.

In FIG. 3a, a mask layer 17 is deposited on a surface 12 of a substrate 11. The mask layer 17 can be a layer of a photoresist material, for example. The mask layer 17 is patterned to define in the mask layer 17 an image that includes a minimum feature size $\lambda$. The minimum feature size $\lambda$ is greater than or equal to a minimum resolution of a lithographic system that is used to pattern the mask layer 17. For instance, the lithographic system can be a conventional photolithography system and the minimum resolution can be determined by a wavelength of a light source carried by the photolithography system and used to project an image on the mask layer 17.

Referring again to FIG. 3a, a mask 21 carries features (23, 25) that also have a minimum feature size $\lambda$ that is greater than or equal to a minimum resolution of the lithographic system. The mask 21 is illuminated by a light source (not shown) and a portion of that light 43 is blocked by the opaque features 23 and another portion of that light 41 passes through the transparent features 25 and exposes the mask layer 17.

Figure 3B:
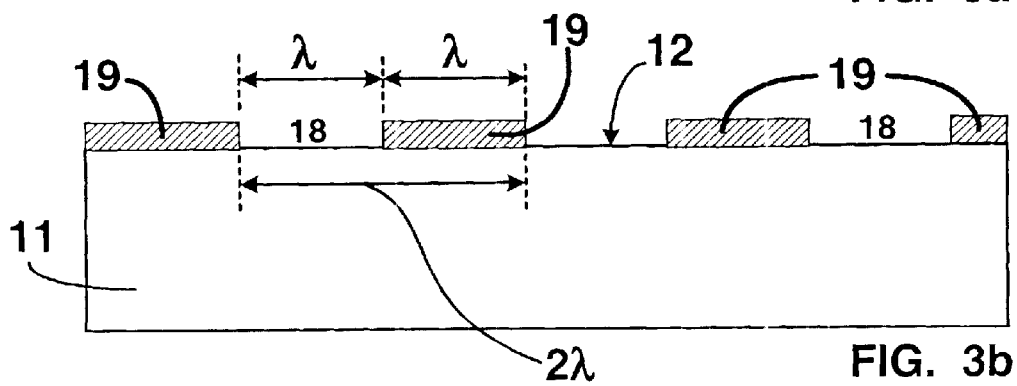
FIG. 3b is a cross-sectional view of the mask layer of FIG. 3a after an etch process according to the present invention.

In FIG. 3b, those portions of the mask layer 17 that are exposed to the light 41 remain after the mask layer 17 is etched and those that were not exposed to the light are removed after the mask layer 17 is etched. After etching, images (18, 19) are defined in the mask layer 17. The images (18, 19) also include the minimum feature size $\lambda$. For example, the images (18, 19) can be defined by submerging the mask layer 17 in a solvent that dissolves those portions of the mask layer 17 that were not exposed to the light 41. As a result, the dissolved portions form the image 18 and the undissolved portions form the image 19.

Figure 3C:
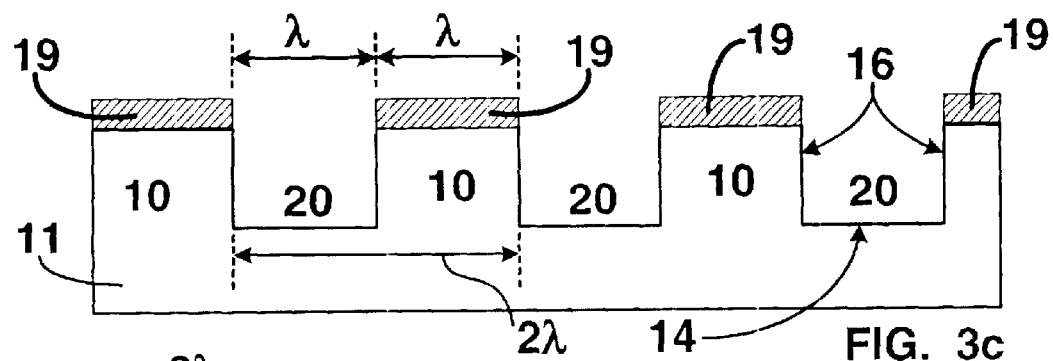
FIGS. 3c and 3d are cross-sectional views of a substrate including features with a minimum feature size after an etch process according to the present invention.

In FIG. 3c, the image 19 covers some portions of the surface 12 of the substrate 11, whereas the image 18 is coincident with the surface 12. The images (18, 19) are then transferred to the substrate 11 by etching the substrate to define features (10, 20). The features (10, 20) include the minimum feature size $\lambda$. The feature 20 is a trench having vertical side wall surfaces 16 and a horizontal surface 14; whereas, the feature 10 is a line also having vertical side wall surfaces 16 and a horizontal surface 12. Because the features (10, 20) include the minimum feature size $\lambda$, a minimum period between a repetition of the features is $2\lambda$.

Figure 3D:
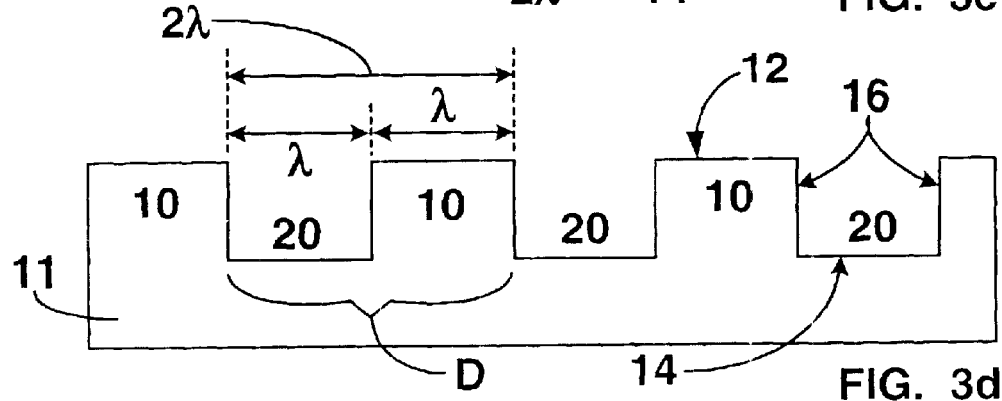

Accordingly, in FIG. 3d, within a distance of $\lambda$, there is density of features equal to one (i.e. 1.0), that is, a single feature 10 or a single feature 20. On the other hand, within a period of 2λ, there is a density of features equal to two (i.e. 2.0), that is, there is a feature 10 and a feature 20.

Figure 4:
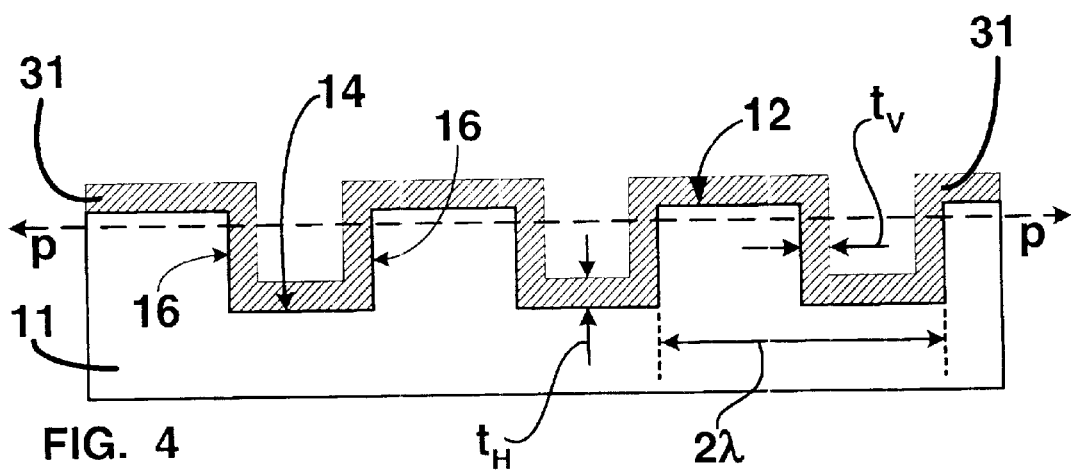
FIG. 4 is a cross-sectional view of a deposited spacer material according to the present invention.

In FIG. 4, a spacer material 31 is deposited on the horizontal surfaces (12, 14) and vertical side wall surfaces 16. The deposition of the spacer material 31 continues until the spacer material 31 has a predetermined thickness ($t_H$, $t_V$) that is less than the minimum feature size λ. That is, a thickness $t_H$ of the spacer material 31 on the horizontal surfaces (12, 14) is less than λ ($t_H<\lambda$) and a thickness $t_V$ of the spacer material on the vertical side wall surfaces 16 is less than λ ($t_V<\lambda$). For example, in a photolithographic process with the minimum feature size λ, the horizontal and vertical side wall thicknesses ($t_H$, $t_V$) are typically in a range from about 0.1 λ to about 0.5 λ. The thicknesses ($t_H$, $t_V$) need not be equal to each other (i.e. $t_H \neq t_V$).

For all of the embodiments described herein the spacer materials (including the spacer material 31) and inlaid spacers as will be described below, can be conformally deposited such that the horizontal and vertical side wall thicknesses ($t_H$, $t_V$) are substantially equal to each other (see FIGS. 4 through 7 and FIGS. 13 through 15). That is, $t_H=t_V$. Moreover, subsequent depositions to increase a density of features within the minimum feature size λ can also be conformal depositions. Additionally, the depositions of the spacer materials can be a combination of non-conformal depositions wherein $t_H \neq t_V$ and conformal depositions wherein $t_H=t_V$.

Techniques for depositing the spacer material 31 include but are not limited to chemical vapor deposition (CVD), plasma enhanced chemical vapor deposition (PECVD), sputtering, plating, and atomic layer deposition (ALD).

Figure 5:
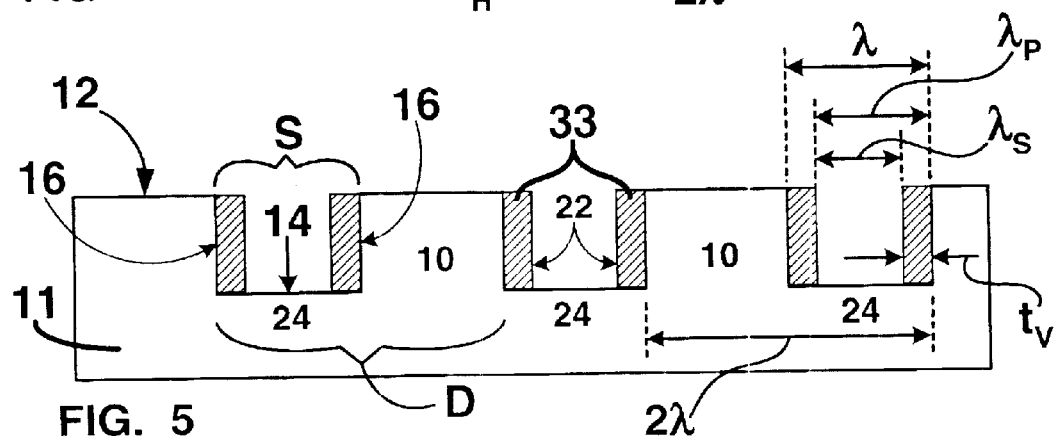
FIG. 5 is a cross-sectional view of sub-lithographic spacers formed by an anisotropic etch process according to the present invention.

In FIG. 5, a density of features within the minimum feature size λ is increased by anisotropically etching the spacer material 31 to selectively remove the spacer material 31 from the horizontal surfaces (12, 14); however, the spacer material 31 remains on the vertical side wall surfaces 16 and defines a plurality of sub-lithographic spacers 33 that are in contact with the vertical side wall surfaces 16 and extend outward therefrom. The sub-lithographic spacers 33 are sub-lithographic because their thickness $t_V$ is less than the minimum feature size λ (i.e. $t_V<\lambda$).

After the anisotropic etching, the density of features within the minimum feature size λ is three, that is, there are two sub-lithographic spacers 33 and a feature 24 (i.e. the feature 24 is the space between the spacers 33, see reference numeral S in FIG. 5). Accordingly, the density of features within the minimum feature size λ is greater than 2.0. Similarly, the density of features within a period of 2λ is four, that is, there are two sub-lithographic spacers 33, one feature 24, and one feature 10 (see reference numeral D in FIG. 5). Consequently, the density of features within a period of 2λ is greater than 3.0.

The sub-lithographic spacers 33 have vertical side wall surfaces 22. A distance $\lambda_S$ between the vertical side wall surfaces 22 in the feature 24 is less than the minimum feature size λ ($\lambda_S<\lambda$). Additionally, a distance $\lambda_P$ between the vertical side wall surfaces 22 within the feature 24 is less than the minimum feature size λ ($\lambda_P<\lambda$). As a result, an inlaid spacer, as will be described below, can optionally fill in the distance $\lambda_S$ and will also have a sub-lithographic size that is less than the minimum feature size λ.

Figure 6:
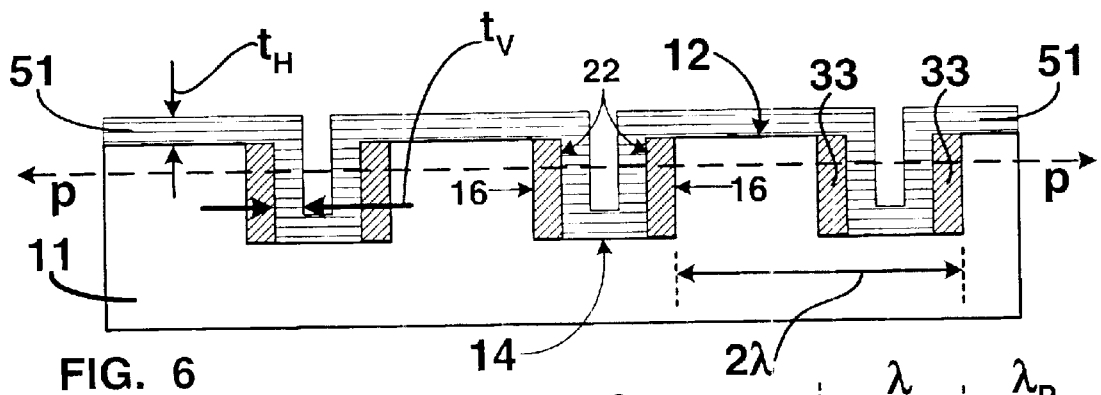
FIG. 6 is a cross-sectional view of another deposited spacer material deposited over the sub-lithographic spacers of FIG. 5 according to the present invention.

In FIG. 6, it may be optionally desired to further increase the density of features within the minimum feature size λ by repeating the deposition and the anisotropic etching steps as described above. A spacer material 51 is deposited on the horizontal (12, 14) and vertical side wall surfaces 22 of the previously formed sub-lithographic spacers 33 and completely fills in the feature 24. The deposition continues until the spacer material 51 has a predetermined thickness ($t_H$, $t_V$) that is less than the minimum feature size λ.

Figure 7:
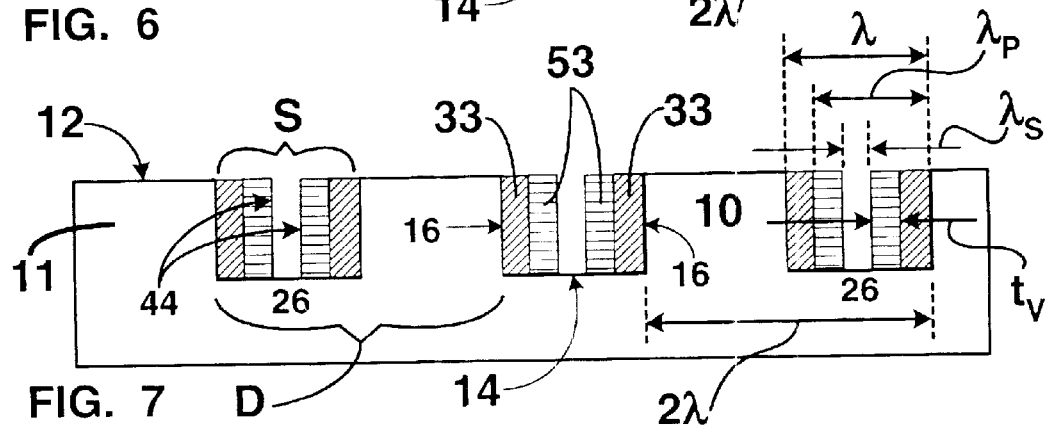
FIG. 7 is a cross-sectional view of additional sub-lithographic spacers formed by an anisotropic etch process according to the present invention.

In FIG. 7, a density of features within the minimum feature size λ is further increased by anisotropically etching the spacer material 51 to selectively remove the spacer material 51 from the horizontal surfaces (12, 14); however, the spacer material 51 remains on the vertical side wall surfaces 22 and defines a plurality of sub-lithographic spacers 53 that are in contact with the vertical side wall surfaces 22 and extend outward therefrom. The sub-lithographic spacers 53 are sub-lithographic because their thickness $t_V$ is less than the minimum feature size λ ($t_V<\lambda$).

After the anisotropic etching, the density of features within the minimum feature size λ is five, that is, there are four sub-lithographic spacers (33, 53) and a feature 26 (see reference numeral S in FIG. 7). Therefore, the density of features within the minimum feature size λ is greater than 4.0. Similarly, the density of features within a period of 2λ is six, that is, there are four sub-lithographic spacers (33, 53), one feature 26, and one feature 10 (see reference numeral D in FIG. 7). Consequently, the density of features within a period of 2λ is greater than 5.0.

The sub-lithographic spacers 53 have vertical side wall surfaces 44. A distance $\lambda_S$ between vertical side wall surfaces 44 in the feature 26 is less than the minimum feature size λ ($\lambda_S<\lambda$). Additionally, a distance $\lambda_P$ between the vertical side wall surfaces 44 within the feature 26 is less than the minimum feature size λ ($\lambda_P<\lambda$). As a result, an inlaid spacer, as will be described below, can optionally fill in the distance $\lambda_S$ and the inlaid spacer will also have a sub-lithographic size that is less than the minimum feature size λ.

After the anisotropic etching step, the substrate 11 can be planarized along a plane (see dashed line p in FIGS. 4 and 6) to form a substantially planar surface. For example, a process such as chemical mechanical planarization (CMP) can be used to planarize the substrate 11.

Figure 8:
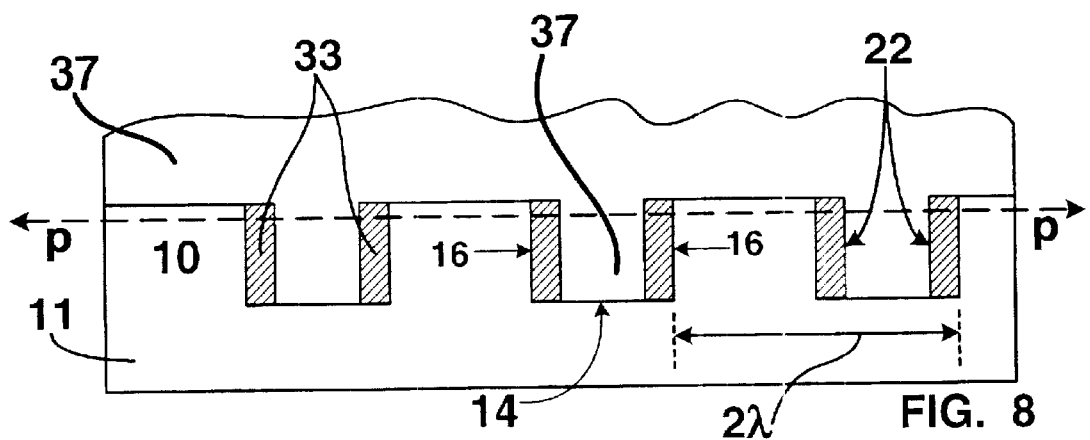
FIGS. 8 and 10 are cross-sectional views of an inlaid material after a deposition process according to the present invention.
Figure 10:
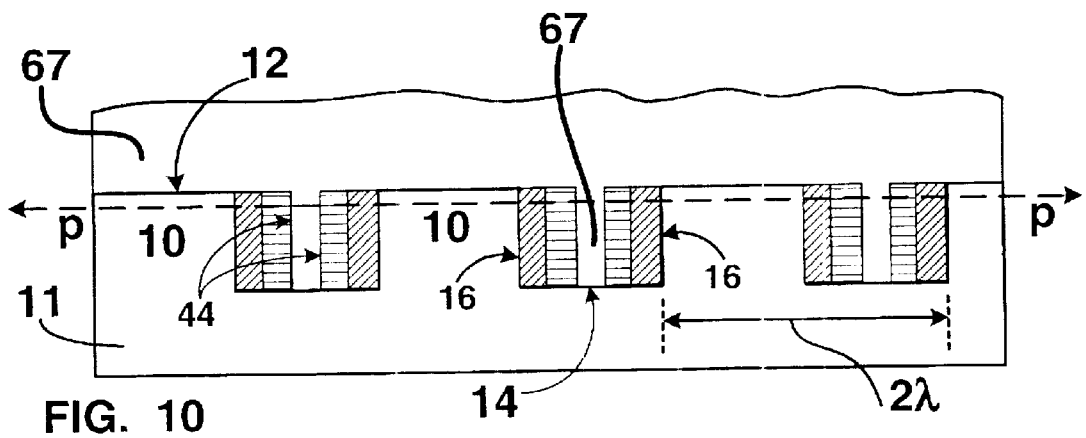

In FIGS. 8 and 10, after completion of the anisotropic etching steps, an inlaid material (37, 67) can be deposited on the substrate 11. The inlaid material (37, 67) completely covers the horizontal surfaces (12, 14), the features (10, 20), and fills in any depressed regions in the substrate, such as those defined by a space between the vertical side wall surfaces (22, 44) of the sub-lithographic spacers (33, 53).

Figure 9:
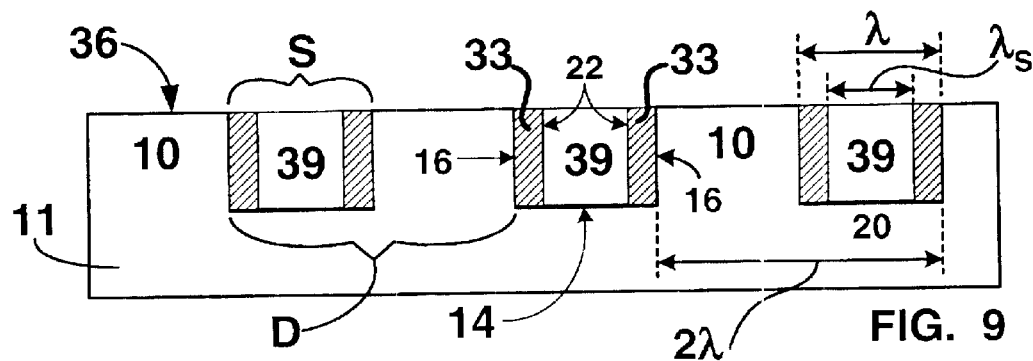
FIGS. 9 and 11 are cross-sectional views of an inlaid spacer formed by a planarization process according to the present invention.
Figure 11:
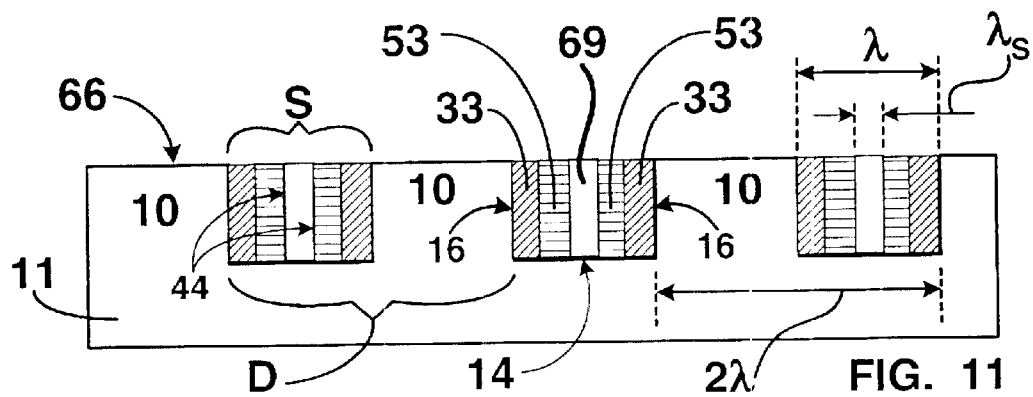

In FIGS. 9 and 11, the substrate 11 is planarized (see dashed line p) to form a substantially planar surface and to define an inlaid spacer (39, 69). For example, a process such as CMP can be used to planarize the substrate 11.

Moreover, in FIGS. 9 and 11, the inlaid spacers (39, 69) are formed between the vertical side wall surfaces (22, 44) of the sub-lithographic spacers (33, 53). The distance $\lambda_S$ between those vertical side wall surfaces (22, 44) is less than the minimum feature size λ. Accordingly, the inlaid spacers (39, 69) are also sub-lithographic because they have a thickness equal to the distance $\lambda_S$ that is also less than then minimum feature size λ.

In FIG. 9, the density of features within the minimum feature size λ is greater than 2.0 as there are two sub-lithographic spacers 33, and the inlaid spacer 39.

In FIG. 11, the density of features within the minimum feature size λ is greater than 4.0 as there are two sub-lithographic spacers 33, two sub-lithographic spacers 53, the inlaid spacer 69.

In FIG. 9, the density of features within the period 2λ is greater than 3.0 as there are two sub-lithographic spacers 33, the inlaid spacer 39, and the feature 10.

In FIG. 11, the density of features within the period 2λ is greater than 5.0 as there are two sub-lithographic spacers 33, two sub-lithographic spacers 53, the inlaid spacer 69, and the feature 10.

Figure 12A:
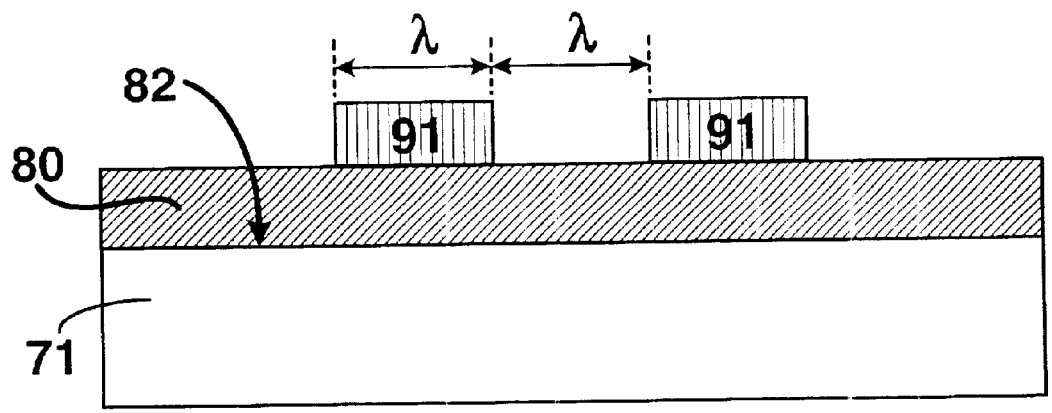
FIGS. 12a and 12b are a cross-sectional view depicting formation of a feature carried by a substrate according to the present invention.

In another embodiment of the present invention, as illustrated in FIG. 12a, a feature layer 80 is deposited on a surface 82 of a substrate 71. Using a photoresist and photolithography process as was described above, a layer of photoresist can be deposited on the feature layer 80, exposed with an image, and the image resolved by etching to form a pattern 91 on the feature layer 80.

Figure 12B:
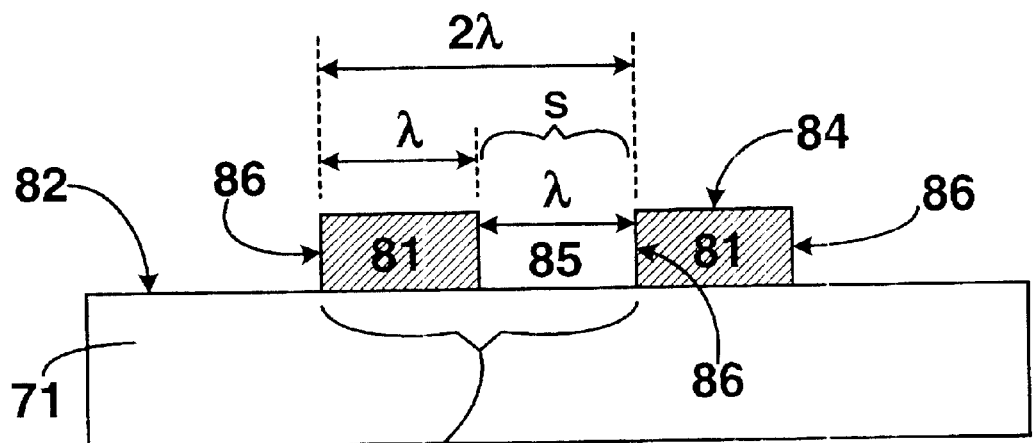

In FIG. 12b, the feature layer 80 is etched to define features (81, 85) that include horizontal surfaces (82, 84) and vertical side wall surfaces 86. The features (81, 85) include the minimum feature size λ that is greater than or equal to a minimum resolution of a lithographic system used for patterning the feature layer 80.

Figure 13:
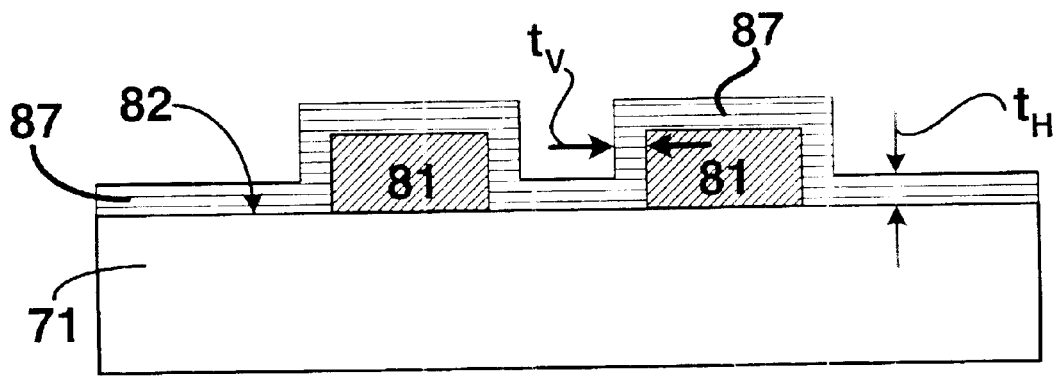
FIG. 13 is a cross-sectional view of a deposited spacer material according to the present invention.

In FIG. 13, a spacer material 87 is deposited on the horizontal surfaces (82, 84), the vertical side wall surfaces 86 of the features (81, 85). The deposition continues until the spacer material 87 has a predetermined thickness ($t_H$, $t_V$) that is less than the minimum feature size λ.

Figure 14:
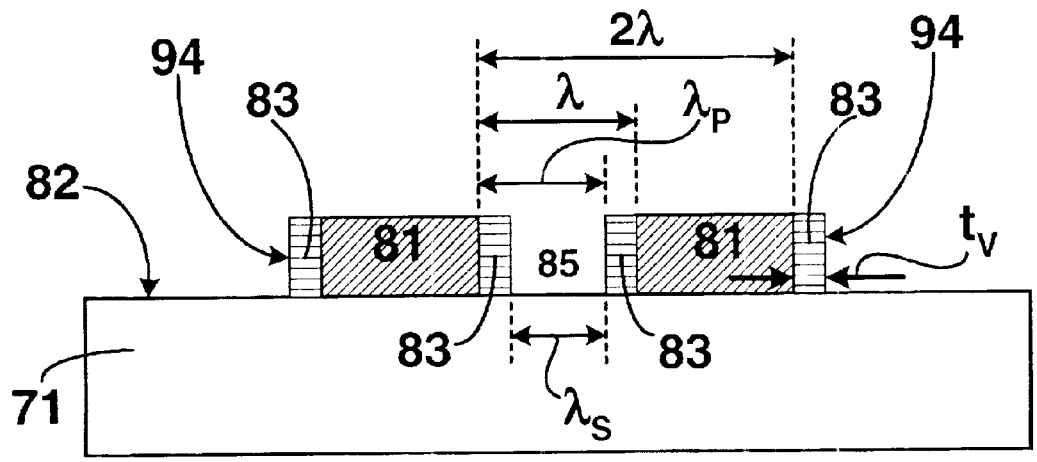
FIG. 14 is a cross-sectional view of sub-lithographic spacers formed by an anisotropic etch process according to the present invention.

In FIG. 14, a density of features within the minimum feature size λ is increased by anisotropically etching the spacer material 87 to selectively remove the spacer material 87 from the horizontal surfaces (82, 84); however, the spacer material 87 remains on the vertical side wall surfaces 86 and defines a plurality of sub-lithographic spacers 83 that are in contact with the vertical side wall surfaces 86. The spacers 83 are sub-lithographic because their thickness $t_V$ is less than the minimum feature size λ ($t_V<λ$).

After the anisotropic etching, the density of features within the minimum feature size λ is three, that is, there are two sub-lithographic spacers 83 and one feature 85. Accordingly, the density of features within the minimum feature size λ is greater than 2.0. Similarly, the density of features within a period of 2λ is four, that is, there are two sub-lithographic spacers 83, one feature 85, and one feature 81. Consequently, the density of features within a period of 2λ is greater than 3.0.

The sub-lithographic spacers 83 have vertical side wall surfaces 94. A distance $λ_S$ between the vertical side wall surfaces 94 in the feature 85 is less than the minimum feature size λ ($λ_S<λ$). Additionally, a distance $λ_P$ between the vertical side wall surfaces 94 within the feature 85 is less than the minimum feature size λ ($λ_P<λ$). As a result, an inlaid spacer (not shown), as was be described above, can optionally fill in the distance $λ_S$ and will also have a sub-lithographic size that is less than the minimum feature size λ.

Optionally, the density of features within the minimum feature size λ can be further increased, as was described above in reference to FIGS. 6 and 7, by repeating the deposition and the anisotropic etching steps. For example, another layer of a spacer material (not shown) is deposited on the horizontal (82, 84) and vertical side wall surfaces 94 of the previously formed sub-lithographic spacers 83. The deposition continues until the spacer material has a predetermined thickness ($t_H$, $t_V$) that is less than the minimum feature size λ.

Figure 15:
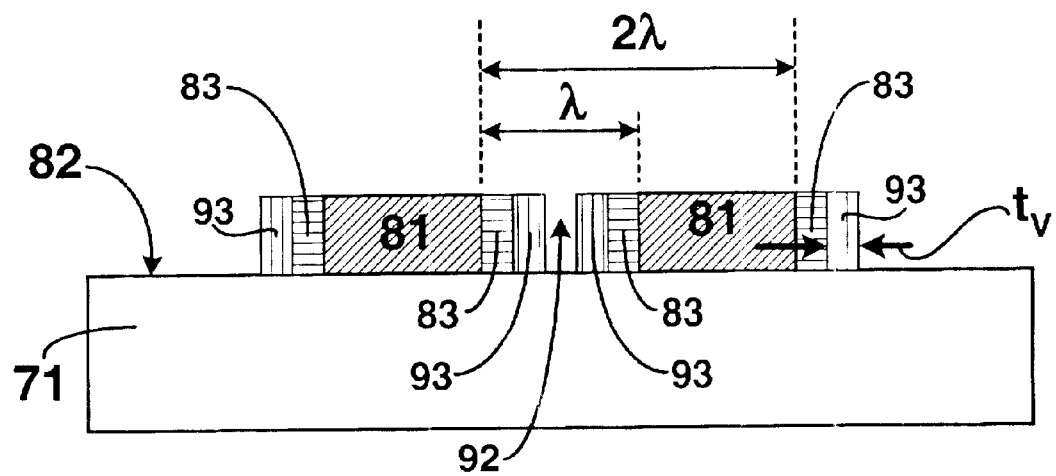
FIG. 15 is a cross-sectional view of additional sub-lithographic spacers formed by an anisotropic etch process according to the present invention.

In FIG. 15, after the anisotropic etching step, a plurality of sub-lithographic spacers 93 are defined on the vertical side wall surfaces 94 of the previously formed sub-lithographic spacers 83. The sub-lithographic spacers 93 are sub-lithographic because their thickness $t_V$ is less than the minimum feature size λ ($t_V<λ$).

Furthermore, the density of features within the minimum feature size λ is five, that is, there are four sub-lithographic spacers (83, 93), a feature 92 (see FIG. 15 where 92 is a space between spacers 93). Therefore, the density of features within the minimum feature size λ is greater than 4.0. Similarly, the density of features within a period of 2λ is six, that is, there are four sub-lithographic spacers (83, 93), one feature 92, and one feature 81. Consequently, the density of features within a period of 2λ is greater than 5.0.

An inlaid material (not shown), as was described above, may be deposited and planarized to form an inlaid spacer (not shown) that fills the feature 92. The inlaid spacer increases the density within the minimum feature size λ and within the period of 2λ as was described above.

Materials for the inlaid spacers (39, 69) and the sub-lithographic spacers (33, 53, 83, 93) include but are not limited to a metal, an electrically conductive material, a semiconductor material, silicon (Si), a dielectric material, and an optical material. The silicon can be polysilicon (α-Si). The metal can be a material including but not limited to aluminum (Al), tungsten (W), tantalum (Ta), and copper (Cu).

Materials for the substrates (11, 71) and the feature layer 80 include but are not limited to a metal, an electrically conductive material, a semiconductor material, silicon (Si), a dielectric material, a glass, and an optical material. The silicon can be single crystal silicon (Si) or polysilicon (α-Si). The metal can be a material including but not limited to aluminum (Al), tungsten (W), tantalum (Ta), and copper (Cu).

One use for the high density sub-lithographic features of the present invention includes a nano-imprint stamp in which one or more of the features, including the sub-lithographic spacers, are selectively etched to remove material along a horizontal surface thereof such that there is a variation in height among the features and the sub-lithographic spacers. Those variations in height can be transferred into a substrate that carries an imprint layer by pressing the nano-imprint stamp into the imprint layer.

Another use for the high density sub-lithographic features of the present invention include an optical component. For example, the optical component can be an optical grating, a polarizing filter, or a neutral density filter. The substrates (11, 71), the spacer, the inlaid spacers, and the feature layer 80, can be optical materials with a high enough band gap to be optically transparent.

For instance, the substrate can be made from a material including but not limited to an optically transparent glass and the spacers or the inlaid spacers can be made from materials including but not limited to magnesium oxide (MgO), silicon oxide ($SiO_2$), tantalum oxide ($Ta_2O_5$), calcium fluoride ($CaF_2$), and magnesium fluoride ($MgF_2$).

The depositions of the materials for the spacers and the inlaid spacers can be accomplished using processes including but not limited to chemical vapor deposition (CVD), plasma enhanced chemical vapor deposition (PECVD), sputtering, plating, and atomic layer deposition (ALD).

The anisotropic etching step can be accomplished using techniques including but not limited to reactive ion etching, ion milling, chemical etching, and plasma etching.

Although several embodiments of the present invention have been disclosed and illustrated, the invention is not limited to the specific forms or arrangements of parts so described and illustrated. The invention is only limited by the claims.

What is claimed is:

1. A method of fabricating high density sub-lithographic features, comprising:
    depositing a mask layer on a substrate;
    patterning the mask layer to define an image thereon including a minimum feature size that is greater than or equal to a minimum resolution of a lithographic system used for the patterning;

etching the substrate to transfer the image to the substrate thereby defining a feature thereon, the feature including the minimum feature size, a horizontal surface positioned entirely within the substrate, and vertical side wall surfaces extending to the horizontal surface;

depositing a spacer material on the horizontal and vertical side wall surfaces until the spacer material has a predetermined thickness that is less than the minimum feature size;

increasing a density of features within the minimum feature size by anisotropically etching the spacer material to selectively remove the spacer material from the horizontal surfaces so that the spacer material remains on the vertical side wall surfaces and defines a plurality of sub-lithographic spacers thereon, the sub-lithographic spacers including a thickness that is less than the minimum feature size; and further increasing the density of features within the minimum feature size until a desired density of features is obtained by repeating the depositing and the anisotropically etching to define additional sub-lithographic spacers on previously defined sub-lithographic spacers, the additional sub-lithographic spacers including a thickness that is less than the minimum feature size.

2. The method as set forth in claim 1, wherein the sub-lithographic spacers are made from a material selected from the group consisting of a metal, an electrically conductive material, a semiconductor material, silicon, and a dielectric material.

3. The method as set forth in claim 1, wherein the substrate is made from a material selected from the group consisting of a metal, an electrically conductive material, a semiconductor material, silicon, a dielectric material, and a glass.

4. The method as set forth in claim 1, wherein the density of features within the minimum feature size is greater than 2.0.

5. The method as set forth in claim 1, wherein the density of features within a period of twice the minimum feature size is greater than 3.0.

6. The method as set forth in claim 1 and further comprising:

after completion of the anisotropic etching step, depositing an inlaid material that completely covers the feature, the sub-lithographic spacers, and fills in any depressed regions on the substrate; and planarizing the substrate to form a substantially planar surface and to define an inlaid spacer.

7. The method as set forth in claim 6, wherein the planarization step comprises chemical mechanical planarization.

8. The method as set forth in claim 6, wherein the inlaid spacers are made from a material selected from the group consisting of a metal, an electrically conductive material, a semiconductor material, silicon, a dielectric material.

9. The method as set forth in claim 6, wherein the density of features within the minimum feature size is greater than 3.0.

10. The method as set forth in claim 6, wherein the density of features within a period of twice the minimum feature size is greater than 4.0.

11. The method as set forth in claim 6, wherein the inlaid spacer has thickness that is less than the minimum feature size.

12. A method of fabricating high density sub-lithographic features, comprising:

depositing a feature layer on a surface of a substrate;

patterning and then etching the feature layer to define a plurality of features extending outward of the substrate and including a horizontal surface, opposed vertical side wall surfaces, and a minimum feature size that is greater than or equal to a minimum resolution of a lithographic system used for the patterning;

depositing a spacer material on the horizontal surface and on all of the vertical side wall surfaces of the plurality of features until the spacer material has a predetermined thickness that is less than the minimum feature size;

increasing a density of features within the minimum feature size by anisotropically etching the spacer material to selectively remove the spacer material from the horizontal surfaces so that the spacer material remains on all of the vertical side wall surfaces and defines a plurality of sub-lithographic spacers thereon, the sub-lithographic spacers including a thickness that is less than the minimum feature size; and further increasing the density of features within the minimum feature size until a desired density of features is obtained by repeating the depositing and the anisotropically etching to define additional sub-lithographic spacers on previously defined sub-lithographic spacers, the additional sub-lithographic spacers including a thickness that is less than the minimum feature size.

13. The method as set forth in claim 12, wherein the sub-lithographic spacers are made from a material selected from the group consisting of a metal, an electrically conductive material, a semiconductor material, silicon, and a dielectric material.

14. The method as set forth in claim 12, wherein the substrate is made from a material selected from the group consisting of a metal, an electrically conductive material, a semiconductor material, silicon, a dielectric material, and a glass.

15. The method as set forth in claim 12, wherein the density of features within the minimum feature size is greater than 2.0.

16. The method as set forth in claim 12, wherein the density of features within a period of twice the minimum feature size is greater than 3.0.

17. The method as set forth in claim 12, wherein the feature layer is a material selected from the group consisting of a metal, an electrically conductive material, a semiconductor material, silicon, a dielectric material, and a glass.

18. The method as set forth in claim 12 and further comprising:

after completion of the anisotropic etching step, depositing an inlaid material that completely covers the feature, the sub-lithographic spacers, and any depressed regions on the substrate; and planarizing the inlaid material, the feature, and the sub-lithographic spacers to form a substantially planar surface and to define an inlaid spacer.

19. The method as set forth in claim 18, wherein the planarization step comprises chemical mechanical planarization.

20. The method as set forth in claim 18, wherein the inlaid spacers are made from a material selected from the group consisting of a metal, an electrically conductive material, a semiconductor material, silicon, a dielectric material.

* * * * *